US00RE45719E

(19) United States
(12) Reissued Patent
Maeda et al.

(10) Patent Number: US RE45,719 E
(45) Date of Reissued Patent: Oct. 6, 2015

(54) SURFACE-COATED CUTTING TOOL

(71) Applicant: MITSUBISHI MATERIALS CORPORATION, Tokyo (JP)

(72) Inventors: Koichi Maeda, Akashi (JP); Masanori Morikawa, Akashi (JP); Yuki Matsuoka, Akashi (JP); Natsuki Ichimiya, Akashi (JP)

(73) Assignee: MITSUBISHI MATERIALS CORPORATION, Tokyo (JP)

(21) Appl. No.: 14/278,380

(22) Filed: May 15, 2014

Related U.S. Patent Documents

Reissue of:
(64) Patent No.: 8,354,177
Issued: Jan. 15, 2013
Appl. No.: 12/672,736
PCT Filed: Aug. 1, 2008
PCT No.: PCT/JP2008/063855
§ 371 (c)(1),
(2) Date: Feb. 9, 2010
PCT Pub. No.: WO2009/022557
PCT Pub. Date: Feb. 19, 2009

(30) Foreign Application Priority Data

Aug. 10, 2007 (JP) ..... 2007-209323

(51) Int. Cl.
*B32B 9/00* (2006.01)
*B23F 21/00* (2006.01)
(Continued)

(52) U.S. Cl.
CPC ..... *B23F 21/00* (2013.01); *C23C 14/0021* (2013.01); *C23C 14/0641* (2013.01);
(Continued)

(58) Field of Classification Search
CPC . B23F 21/00; C23C 14/0021; C23C 14/0641; C23C 28/044; C23C 28/42; C23C 30/005
USPC ..... 51/307, 309; 428/216, 336, 697, 698, 428/699
See application file for complete search history.

(56) References Cited

U.S. PATENT DOCUMENTS 5,580,653 A 12/1996 Tanaka et al.
7,060,345 B2 * 6/2006 Fukui et al. ..... 428/216
(Continued)

FOREIGN PATENT DOCUMENTS

JP 07-310174 A 11/1995
JP 2793773 A 11/1995
(Continued)

OTHER PUBLICATIONS

International Search Report dated Sep. 30, 2008, issued on PCT/JP2008/063855.
(Continued)

*Primary Examiner* — Sean E Vincent
(74) *Attorney, Agent, or Firm* — Locke Lord LLP

(57) ABSTRACT

This invention provides a surface-coated cutting tool which exhibits excellent fracture resistance and wear resistance in high-speed cutting, such as high-speed gear cutting, high-speed milling, and high-speed drilling. The surface-coated cutting tool includes a hard coating layer composed of an alternately laminated layer structure of at least a thin layer A and a thin layer B formed on the surface of a tool substrate, such as a cemented carbide substrate, a cermet substrate, and a high-speed tool steel substrate. The thin layer A is an (Al, Cr, Si)N layer which satisfies a compositional formula: $[Al_XCr_YSi_Z]N$ ($0.2 \le X \le 0.45$, $0.4 \le Y \le 0.75$, $0.01 \le Z \le 0.2$, and $X+Y+Z=1$ in terms of atomic ratio). The thin layer B is an (Al, Ti, Si)N layer which satisfies a compositional formula: $[Al_UTi_VSi_W]N$ ($0.05 \le U \le 0.75$, $0.15 \le V \le 0.94$, $0.01 \le W \le 0.1$, and $U+V+W=1$ in terms of atomic ratio).

8 Claims, 4 Drawing Sheets

(51) Int. Cl.

| | |
|---|---|
| ***C23C 14/06*** | (2006.01) |
| ***C23C 28/00*** | (2006.01) |
| ***C23C 28/04*** | (2006.01) |
| ***C23C 30/00*** | (2006.01) |
| ***C23C 14/00*** | (2006.01) |

(52) U.S. Cl.
CPC ..... *C23C28/044* (2013.01); *C23C 28/42* (2013.01); *C23C 30/005* (2013.01); *Y10T 407/17* (2015.01); *Y10T 407/1948* (2015.01); *Y10T 408/78* (2015.01); *Y10T 428/24975* (2015.01); *Y10T 428/265* (2015.01)

(56) References Cited

U.S. PATENT DOCUMENTS

| | | | | |
|---|---|---|---|---|
| 7,166,155 | B2 * | 1/2007 | Ishikawa | 428/699 |
| 7,901,796 | B2 * | 3/2011 | Fukui et al. | 428/697 |

FOREIGN PATENT DOCUMENTS

| | | | |
|---|---|---|---|
| JP | 2002-337007 | * | 11/2002 |
| JP | 2002-337007 | A | 11/2002 |
| JP | 2003-071611 | * | 3/2003 |
| JP | 2003-071611 | A | 3/2003 |
| JP | 2003-321764 | A | 11/2003 |
| JP | 2004-130514 | A | 4/2004 |
| JP | 2004-176085 | * | 6/2004 |
| JP | 2004-176085 | A | 6/2004 |
| JP | 2005-262388 | A | 9/2005 |
| JP | 2005-305576 | * | 11/2005 |
| JP | 2005-305576 | A | 11/2005 |
| JP | 2005-344148 | * | 12/2005 |
| JP | 2005-344148 | A | 12/2005 |
| JP | 2006-175569 | A | 7/2006 |
| JP | 2007-083325 | A | 4/2007 |
| JP | 2007-152456 | A | 6/2007 |

OTHER PUBLICATIONS

Notice of Reasons for Rejection mailed Apr. 9, 2012, issued for the corresponding Japanese Application No. 2007-209323 and English translation thereof.

* cited by examiner (a)

(b)

SURFACE-COATED CUTTING TOOL

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a reissue application of U.S. Pat. No. 8,354,177, granted Jan. 15, 2013 which claims the right of priority under 35 U.S.C. §119 based on Japanese Patent Application No. 2007-209323 filed Aug. 10, 2007.*

TECHNICAL FIELD

The present invention relates to a surface-coated cutting tool (hereinafter referred to as a coated tool) in which a hard coating layer has excellent high-temperature hardness, high-temperature toughness, high-temperature strength, and thermoplastic deformation resistance.

This hard coating layer has excellent fracture resistance and wear resistance, and exhibits excellent tool performance for a prolonged period of time; even when being used for cutting processes, for example, high-speed gear cutting, high-speed milling, and high-speed drilling, in which high temperature is generated, and also a large impact and mechanical load is applied to a cutting edge.

BACKGROUND ART

As the coated tools, the tools;

an insert, which is detachably attached to a edge portion of a holder, used for turning or planing various workpieces made of steel and/or cast iron;

a drill and a Printed Circuit Board drill used for drilling the workpieces;

an end mill used for face milling, slotting and shoulder milling the workpieces; and a solid hob cutter and a shaper cutter used for gear cutting a tooth profile of the workpieces;

are generally known.

Further, a coated tool: wherein its tool substrate, namely, tool body, is made of, for example, a tungsten-carbide (hereinafter shown by WC) based cemented carbide, a titan-carbonitride (hereinafter shown by TiCN) based cermet, or a high-speed tool steel (hereinafter referred to as high-speed steel);

to improve its thermal resistance and wear resistance, at least one or more layers of hard coating layers composed of a complex nitride layer of Al, Cr, and Si (hereinafter shown by an (Al, Cr, Si)N layer) are provided on the surface of the tool substrate; and when expressing a composition of the complex nitride layer as a compositional formula $[Al_XCr_YSi_X]N$, each X, Y and Z satisfies the relations, $$0.75 \leq X \leq 0.95,\ 0.05 \leq Y \leq 0.25,\ \text{and}\ X+Y+Z=1$$

(where all of X, Y, and Z are atomic ratios);

is specifically known.

Also, a coated tool: wherein to improve its oxidation resistance and wear resistance, at lease one or more of hard coating layers composed of a complex nitride layer of Al, Ti, and Si (hereinafter shown by an (Al, Ti, Si)N layer) are provided on the surface of the tool substrate; and when expressing a composition of the complex nitride layer as a compositional formula $[Al_UTi_VSi_W]N$, each U, V and W satisfies the relations, $$0.05 \leq U \leq 0.75,\ 0.01 \leq W \leq 0.10,\ \text{and}\ U+V+W=1$$

(where all of U, V, and W are atomic ratios);

is known.

Further, a process for manufacturing, the above conventional coated tool is known.

This process is:

the above tool substrate is placed into an arc ion plating apparatus that is one type of a physical vapor deposition apparatus, for example, shown in the schematic explanatory view of FIG. 2:

under a condition that the inside of the apparatus is heated up to a temperature of 500° C. for example, arc discharge between a cathode (evaporation source) and an anode is generated with an electric current of 90 A for example, wherein the cathode has a component composition according to the type of hard coating layer to be vapor-deposited and formed on the tool substrate:

simultaneously, a nitrogen gas, which is a reaction gas, is introduced into the apparatus to create a reaction atmosphere of 2 Pa:

further, a bias voltage of −100 V, for example, is applied to the above tool substrate:

the above hard coating layer is formed on the surface of the tool substrate.

[Patent Document 1] Japanese Unexamined Patent Application Publication No. 2006-175569

[Patent Document 2] Japanese Patent No. 2793773

DISCLOSURE OF THE INVENTION

Problems that the Invention is to Solve

In recent years, the performance of machine tools for cutting has been remarkably enhanced, and demand for labor-saving and energy-saving in cutting process and cost reduction has increased.

Accordingly, the cutting process tends to be carried out at a higher speed increasingly. The above conventional coated tools encounter no particular problems when being used in cutting process for steel, cast iron, etc. under normal cutting conditions. However, when these conventional coated tools are used for cutting processes, for example, high-speed gear cutting, high-speed milling, and high-speed drilling, in which high temperature is generated, and a large impact and mechanical load is applied to a cutting edge; the tool life of these tools is not so long period.

The insufficient toughness of the hard coating layer, the occurrence of partial wear caused by thermoplastic deformation, and/or the like, make the occurrence of chipping and/or fractures uncontrolled; and also progress of wear is accelerated. Therefore, the tool life of these tools becomes shortened comparatively.

Means for Solving the Problems

Thus, the present inventors have obtained the following knowledge from the above-described viewpoints as a result of paying attention to and studying a layer forming material which constitutes the hard coating layers of the above conventional coated tools, and its structure in order to develop a coated tool in which the hard coating layer exhibits excellent fracture resistance and wear resistance under cutting conditions, such as high-speed gear cutting, high-speed milling, and high-speed drilling, in which high temperature is generated, and a large impact and mechanical load is applied to a cutting edge.

(a) The Al component in the (Al, Cr, Si)N layer which constitutes the hard coating layer of the above conventional coated tool (refer to Patent Document 1) has an effect of improving high-temperature hardness. The Cr component in the (Al, Cr, Si)N layer has an effect of improving high-temperature toughness and high-temperature strength. Both Al and Cr components in the (Al, Cr, Si)N layer have an effect of improving high-temperature oxidation resistance in a state of coexisting with each other. Further, Si component in the (Al, Cr, Si)N layer has an effect of improving thermoplastic deformation resistance.

However, the above high-temperature toughness and high-temperature strength are not sufficient for severe cutting conditions, such as high-speed gear cutting, high-speed milling, and high-speed drilling, in which high temperature is generated, and also a large impact and mechanical load is applied to a cutting edge. Therefore, this problem causes chipping, fractures, and etc.

If an attempt, in which a Cr content ratio is increased for improving high-temperature toughness and high-temperature strength, is carried out; this attempt also makes the Al content ratio decreased relatively, and then the wear resistance deteriorates. Therefore, there is a limit to the suppression and improvement of the chipping resistance and fracture resistance in the hard coating layer composed of the (Al, Cr, Si)N layer.

(b) On the other hand, the Al component and Si component in the (Al, Ti, Si)N layer which constitutes the hard coating layer of the above conventional coated tool (refer to Patent Document 2) has the same effects as described above.

Also the Ti component in the (Al, Ti, Si)N layer has an effect of further improving high-temperature toughness and high-temperature strength.

Therefore, the hard coating layer composed of the (Al, Ti, Si)N layer exhibits excellent chipping resistance and fracture resistance under severe cutting conditions, such as the high-speed gear cutting, high-speed milling, and high-speed drilling. However, since the high-temperature hardness and thermoplastic deformation resistance are insufficient, the wear resistance is poor.

(c) Thus, an attempt to form a hard coating layer; which has an alternately laminated layer structure of thin layer A composed of the (Al, Cr, Si)N layer of the above (a) with a predetermined composition and a predetermined thickness, and thin layer B composed of the (Al, Ti, Si)N layer of the above (b) with a predetermined composition and a predetermined thickness;

was carried out.

Each thin layer A and thin layer B, which compose the alternately laminated layer structure of the hard coating layer, has each composition in a predetermined range, and has each thickness in a predetermined range.

Thereby, the hard coating layer can have the excellent wear resistance of the thin layer A and the excellent high-temperature toughness and high-temperature strength of the thin layer B as the whole hard coating layer.

Therefore, the coated tool, on which the hard coating layer having a structure in alternately laminated layer of the thin layers A and B is formed, can exhibit excellent chipping resistance, fracture resistance, and wear resistance; even when this coated tool is used for cutting process under severe cutting conditions, such as high-speed gear cutting, high-speed milling, and high-speed drilling, in which high temperature is generated, and a large impact and mechanical load is applied to a cutting edge.

The invention was made on the basis of the above knowledge.

(1) In a surface-coated cutting tool (coated tool) comprising a hard coating layer formed on the surface of a tool substrate, the hard coating layer is composed of an alternately laminated layer structure of at least a thin layer A and a thin layer B; and the thin layer A has a thickness of 0.01 to 0.1 μm, the thin layer B has a thickness of 0.01 to 0.1 μm, and a total thickness of the thin layers A and B is within 1 to 10 μm:

wherein (a) the thin layer A is a complex nitride layer of Al, Cr and Si ((Al, Cr and Si)N layer), and when expressing a composition of the complex nitride layer as a compositional formula $[Al_X Cr_Y Si_Z]N$, each X, Y and Z satisfies the relations, $$0.2 \leq X \leq 0.45,\ 0.4 \leq Y \leq 0.75,\ 0.01 \leq Z \leq 0.2,\ \text{and}\ X+Y+Z=1$$

(where all of X, Y, and Z are atomic ratios); and (b) the thin layer B is a complex nitride layer of Al, Ti, and Si ((Al, Ti and SON layer), and when expressing a composition of the complex nitride layer as a compositional formula $[Al_U Ti_V Si_W]N$, each U, V and W satisfies the relations, $$0.05 \leq U \leq 0.75,\ 0.15 \leq V \leq 0.94,\ 0.01 \leq W \leq 0.1,\ \text{and}\ U+V+W=1$$

(where all of U, V, and W are atomic ratios).

(2) In the surface-coated cutting tool (coated tool) described in the above (1), its hard coating layer includes an upper layer composed of an alternately laminated layer structure of the thin layer A and the thin layer B, and a under layer formed so as to be interposed between the upper layer and the surface of the tool substrate;

wherein the under layer has a thickness of 0.5 to 10 μm, and has a composition which satisfies the compositional formula of the thin layer A.

(3) In the surface-coated cutting tool (coated tool) described in the above (1), its hard coating layer includes an upper layer having an alternately laminated layer structure of the thin layer A and the thin layer B, and a under layer formed so as to be interposed between the upper layer and the surface of a tool substrate;

wherein the under layer has a thickness of 0.5 to 10 μm, and has a composition which satisfies the compositional formula of the thin layer B.

(4) A surface-coated cutting tool (coated tool) according to the surface-coated cutting tool (coated tool) described in any one of the above (1) to (3) is a gear cutter in which its tool substrate, namely body, is made of a high-speed tool steel.

(5) A surface-coated cutting tool (coated tool) according to the surface-coated cutting tool (coated tool) described in any one of the above (1) to (3) is an end mill in which its tool substrate, namely body, is made of a high-speed tool steel.

(6) A surface-coated cutting tool (coated tool) according to the surface-coated cutting tool (coated tool) described in any one of the above (1) to (3) is an end mill or a drill in which its tool substrate, namely body, is made of a tungsten-carbide-based cemented carbide.

Next, the reasons for limiting numerical values as described above regarding the hard coating layer of the coated tool of the invention will be described below.

(a) Thin Layer A

The Al component in the thin layer A composed of the (Al, Cr, SON layer has an effect of improving high-temperature hardness. The Cr component in the thin layer A composed of the (Al, Cr, Si)N layer has an effect of improving high-temperature toughness and high-temperature strength. The Al and Cr components in the thin layer A composed of the (Al, Cr, Si)N layer have an effect of improving high-temperature oxidation resistance in a state of coexisting with each other.

Further, the Si component in the thin layer A composed of the (Al, Cr, Si)N layer has an effect of improving thermoplastic deformation resistance.

If the X value (atomic ratio) indicating the content ratio of Al to the total content including Cr and Si, is less than 0.2; minimum high-temperature hardness and high-temperature oxidation resistance cannot be achieved, and such X value causes acceleration of wear.

On the other hand, if the X value exceeds 0.45; high-temperature toughness and high-temperature strength decreases, and also such X value causes occurrence of chipping or fractures.

Therefore, the X value was determined in the range of 0.2 to 0.45.

Additionally, if the Y value (atomic ratio) indicating the content ratio of Cr to the total content including Al and Si, is less than 0.4; the required minimum high-temperature toughness and high-temperature strength cannot be achieved, and also the occurrence of chipping or fractures becomes uncontrolled.

On the other hand, if the Y value exceeds 0.75; the content ratio of Al decreases relatively, and also such Y value accelerates the progress of wear.

Therefore, the Y value was determined in the range of 0.4 to 0.75. Moreover, if the Z value (atomic ratio) indicating the content ratio of Si to the total content including Al and Cr, is less than 0.01; the improvement of wear resistance accompanied by the improvement of thermoplastic deformation resistance cannot be expected.

On the other hand, if the Z value exceeds 0.2; the wear-resistance improving effect shows a tendency to decrease. Therefore, the Z value was determined in the range of 0.01 to 0.2.

In addition, especially preferable ranges regarding the above X, Y, and Z are $0.35 \leq X \leq 0.45$, $0.4 \leq Y \leq 0.55$, and $0.03 \leq X \leq 0.10$ respectively.

(b) Thin Layer B

The thin layer B is composed of the (Al, Ti, Si)N layer, and constitutes an alternately laminated layer structure along with the thin layer A.

The thin layer B is provided as a layer for making up for the performance (high-temperature toughness and high-temperature strength) which the thin layer A lacks.

As already described the thin layer A containing the Al and Si components, in particular, has excellent wear resistance which these components provide. Also, the Cr component contained in the thin layer A contributes for maintaining a predetermined chipping resistance and fracture resistance.

However, in order to use the coated tool under severe cutting conditions, such as high-speed gear cutting, high-speed milling, and high-speed drilling, in which high temperature is generated, and a large impact and mechanical load is applied to its cutting edge; the thin layer A is required to have far superior high-temperature toughness and high-temperature strength.

In order to secure these performances, the thin layer A including a more large amount of Cr is required.

However, in such thin layer A, the content ratios of Al and Si become small.

In that case, the high-temperature hardness and high-temperature oxidation resistance of the thin layer A become insufficient, and the wear resistance also becomes deteriorated. Therefore, it is impossible to increase further the Cr content ratio in the thin layer A.

Thus, in this invention, the thin layer B composed of the (Al, Ti, Si)N layer is laminated alternately with the above thin layer A. By forming the hard coating layer having an alternately laminated layer structure of the thin layers A and B on the tool; the thin layers A and B become adjacent to each other; and thus good performance of the thin layer B, namely the excellent high-temperature toughness and the high-temperature strength, can make up for such characters which the thin layer A lacks, without losing good characters of the thin layer A, namely, the excellent high-temperature toughness and the thermoplastic deformation resistance. Therefore, the hard coating layer as a whole can exhibit the performance; excellent chipping resistance, fracture resistance, and wear resistance.

The operational effects of the Al component and Si component in the compositional formula of the thin layer B are the same as those of the thin layer A. However, if the U value (atomic ratio) indicating the content ratio of Al is less than 0.05, or the W value (atomic ratio) indicating the ratio of Si is less than 0.01; the required minimum predetermined high-temperature hardness, high-temperature oxidation resistance, and thermoplastic deformation resistance cannot be achieved; and also such U value causes occurrence of wear resistance deterioration.

Additionally, if the U value exceeds 0.75; the content ratio of Ti decreases relatively, and then the effects of improving the high-temperature toughness and high-temperature strength cannot be expected from such U value.

If the W value exceeds 0.1, the wear-resistance improving effect shows a tendency to decrease.

Therefore, the U value indicating the content ratio of Al was determined in the range of 0.05 to 0.75; and also the W value indicating the content ratio of Si was determined in the range of 0.01 to 0.1.

Additionally, if the V value (atomic ratio) indicating the content ratio of Ti is less than 0.15; the effect of further improving the superiority of the high-temperature toughness and high-temperature strength cannot be expected. On the other hand, if the V value exceeds 0.94; required minimum high-temperature hardness and high-temperature oxidation resistance cannot be achieved due to a relative decrease in the content ratios of Al component and Si component.

Therefore, the V value indicating the content ratio of Ti was determined in the range of 0.15 to 0.94.

In addition, especially preferable ranges regarding the above U, V, and W are $0.45 \leq U \leq 0.55$, $0.4 \leq V \leq 0.5$, and $0.03 \leq W \leq 0.07$ respectively.

(c) Thickness of Layer

If the thicknesses of the thin layer A and the thin layer B are less than 0.01 μm; to form surly the thin layers having such thicknesses and a target composition is very difficult, and also the effect of improving the wear resistance by the thin layer A and the effect of improving the high-temperature toughness by the thin layer B cannot be achieved well. On the other hand, if the thicknesses of the thin layer A and the thin layer B exceed 0.1 μm; the drawbacks of each thin layer, i.e., the lack of toughness and strength in the thin layer A, and the lack of wear resistance in the thin layer B, appear locally within the layers; and then the risk, that the performance of the hard coating layer as a whole become deteriorated, will increase.

Therefore, the thicknesses of the thin layer A and the thin layer B were determined in the range of 0.01 to 0.1 μm, respectively.

The thin layer B is provided to compensate for the performance which is lacking for the thin layer A.

Further, if the thicknesses of each thin layer A and B are within a range of 0.01 to 0.1 μm; the hard coating layer composed of the alternately laminated layer structure of each thin layer A and B, can perform as if to become one layer having the excellent high-temperature toughness and high-temperature strength without losing the excellent high-temperature hardness, high-temperature oxidation resistance, and thermoplastic deformation resistance.

However, if the thicknesses of the thin layer A and the thin layer B exceed 0.1 μm; the lack of toughness and strength of the thin layer A and the lack of wear resistance of the thin layer B shown.

Additionally, if the total thickness of the layer (upper layer) composed of an alternately laminated layer structure of the thin layer A and the thin layer B, is less than 1 μm; such layer cannot exhibit the above excellent performance. On the other hand, if the total thickness exceeds 10 μm; in such layer, chipping or fractures tends to arise. Thus, the total thickness of the layer (upper layer) composed of an alternately laminated layer structure of the thin layers A and B, was determined in the range of 1 to 10 μm, preferably, 1 to 5 μm.

(d) Under Layer

If the alternately laminated layer structure mentioned above is composed by forming alternately the thin layers A and B directly on the surface of a tool substrate by using, for example, physical vapor deposition; a compressive residual stress will occur within the layers.

Further, if a coated tool provided with such hard coating layer is used under excessively severe cutting conditions, this compressive residual stress makes the adhesion strength between the tool substrate and the hard coating layer unstable.

Thus, in such a case, it is necessary to further enhance the adhesion strength between the surface of the tool substrate and the hard coating layer having an alternately laminated layer structure.

As a means for enhancing the adhesion strength, to form a under layer, namely, a foundation layer, on the surface of the tool substrate is effective.

In particular, in the present invention, the hard coating layer is constructed of an upper layer and a under layer. The upper layer is composed of the alternately laminated layer structure of the thin layers A and B. The under layer is formed interposingly between the upper layer and the surface of the tool substrate.

Further, the formed under layer, in which its thickness is from 0.5 to 10 μm, and its composition is the same composition as the thin layer A or the thin layer B, has an improved adhesion strength between the tool substrate and the hard coating layer. Also, it is confirmed that a coated tool with this under layer can perform stable cutting processes without occurrences of peeling and/or fracture in the hard coating layer, even if this tool is used under excessively severe cutting conditions.

In addition, if the thickness of the under layer is less than 0.5 μm; such thickness does not give the effect of improving the adhesion strength.

On the other hand, if the thickness exceeds 10 μm; the accumulation of the residual compressive stresses makes a crack easy to occur to the layer, and then stable adhesion strength cannot be secured.

Thus, the thickness of the under layer was determined in the range of 0.5 to 10 μm, preferably, 2 to 6 μm.

(e) Tool Substrate

Conventionally known various substrates, namely, bodies, such as WC-based cemented carbide, TiCN-based cermet, and high-speed tool steel (high-speed steel) are usable as the tool substrate of the coated tool.

On the surfaces of these various tool substrates, a hard coating layer is formed by using, for example, physical vapor deposition. In this case, in order to further enhance the adhesion strength between the substrate and the hard coating layers; the tool substrate, in which its surface roughness is equal to or less than JIS (Japanese Industrial Standards) Rz 1.6 μm, is preferable.

In addition, in this invention, a coated tool; in which its exterior surface is a colored layer, for example, a TiN layer (golden color) for the purpose of the distinguishing between used and unused tools; is available. The thickness of 0.5 μm or less is sufficient for this layer.

Advantage of the Invention

In the surface-coated cutting tool of the present invention, the hard coating layer is constructed of the alternately laminated layer structure of the thin layer A, which is at least composed of an (Al, Cr, Si)N layer, and the thin layer B, which is composed of an (Al, Ti, Si)N layer. Such structure can provide excellent high-temperature hardness, high-temperature toughness, high-temperature strength, and thermoplastic deformation resistance for the tool. Additionally, the tinder layer; which is formed as a lower layer, and has the same composition as that of the thin layer A or the thin layer B; can improve the adhesion strength.

Therefore, even if the tool is used in the high-speed gear cutting, high-speed milling, and high-speed drilling in which high temperature is generated, and a large impact and mechanical load is applied to a cutting edge, the hard coating layer can exhibit excellent high-temperature hardness, high-temperature toughness, high-temperature strength, and thermoplastic deformation resistance. As a result, excellent fracture resistance and wear resistance can be exhibited for a prolonged period of time without the occurrence of chipping, fractures, partial wear, and/or peeling.

BRIEF DESCRIPTION OF THE DRAWINGS

FIG. 1A is a schematic plan view and FIG. 1B is a schematic front view.

BEST MODE FOR CARRYING OUT THE INVENTION

Next, a coated tool of the invention will be specifically described by means of examples.

EXAMPLE 1

Figure 3:
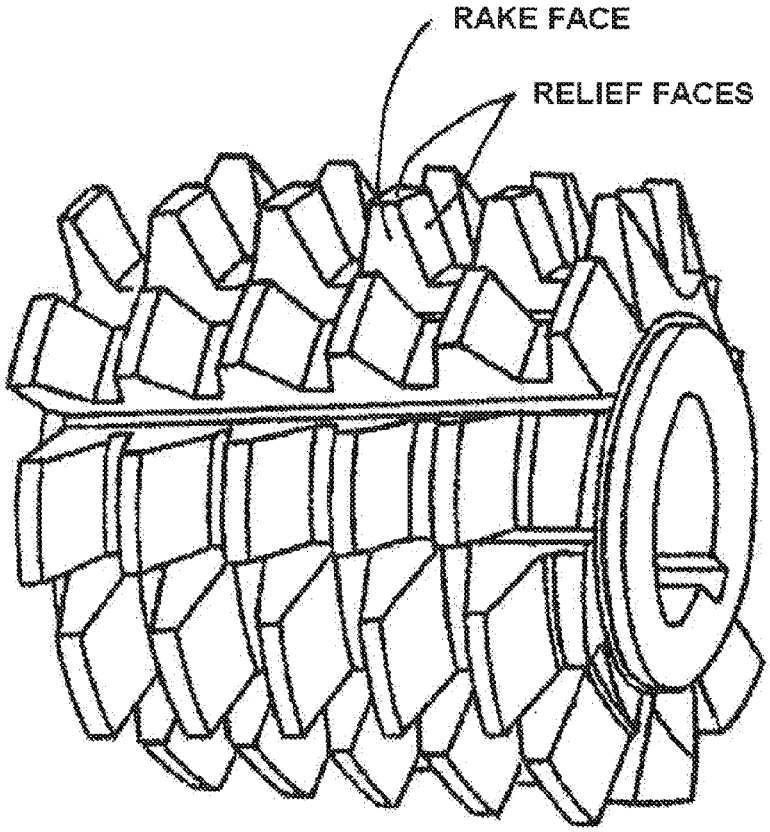
FIG. 3 is a schematic perspective view of a solid hob cutter.

High-speed steel gear cutter bodies, namely, substrates, (solid hob cutters) having a shape shown in FIG. 3 were prepared. The material of these solid hob cutters is high-speed tool steels of JIS-SKH51 or JIS-SKH55, and has a cylindrical shape in which dimensions are, Diameter 90 mm×Length 130 mm. Further, by machining the material, the high-speed steel gear cutter bodies (solid hob cutters) were manufactured. These solid hob cutters have a shape in which overall dimensions are Diameter 85 mm×Length 100 mm. Also these solid hob cutters are counterclockwise quadruple thread gears hob cutter having 16 gashes.

The following procedure of (a) to (d) was carried on to manufacture coated high-speed steel gear cutters (solid hob cutter).

(a) Each high-speed steel gear cutter body (solid hob cutter) made of the above two kinds of material is cleaned by ultrasonic cleaning in acetone, and then dried. Thereafter, each body is placed on a turntable of an arc ion plating apparatus shown in FIG. 1. The position, where each body is placed, is radially outwardly apart from the central axis of the turntable with a predetermined distance, and is by the side of the turntable's outer peripheral portion.

Figure 1:
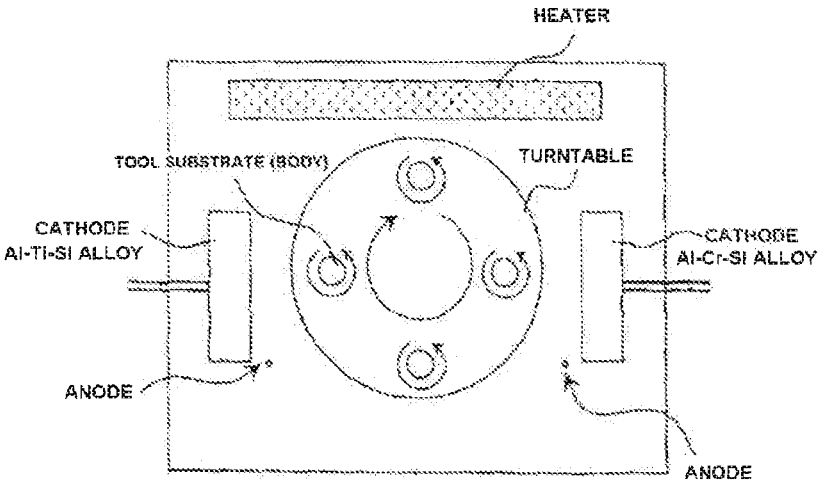
FIGS. 1A and 1B shows an arc ion plating apparatus used for forming a hard coating layer of a coated tool of the invention.
Figure 1:
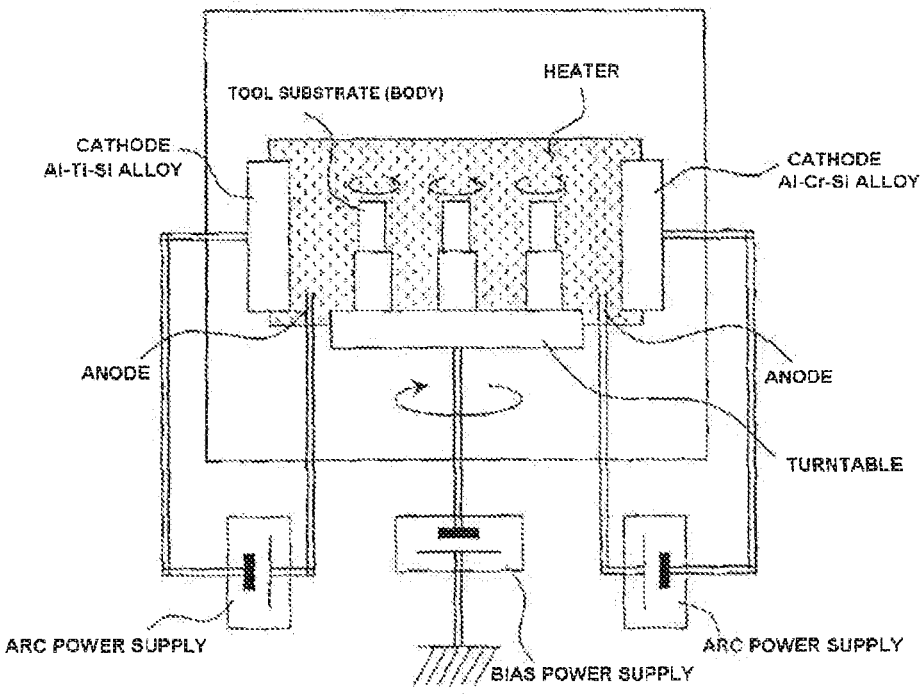

A cathode (evaporation source) located at a one side, left side in FIG. 1, is an Al—Cr—Si alloy for formation of a thin layer A, and has a component composition corresponding to a target composition shown in Table 1. Another cathode (evaporation source) located at the other side, right side in FIG. 1, is an Al—Ti—Si alloy for formation of a thin layer B, and has a component composition corresponding to a target composition shown in Table 1. These cathodes are arranged to face each other across the turntable. (In the case that the two types of cathodes are there, one of cathodes for formation of the thin layers A and B can be used also as a cathode for formation of a under layer. In addition, a third electrode as the electrode only for formation of a under layer is quite possible to be provided.)

(b) The inside of the apparatus is evacuated to a pressure of 0.1 Pa or less; and then keeping this pressure level, the inside of the apparatus is heated up to 400° C. with a heater. Further, turning the turntable, a DC bias voltage of −800 V is applied to a gear cutter body, which is rotating and is placed on the turntable. Additionally, applying a current of 100 A between an anode and an electrode for bombardment cleaning (for example, an Al—Cr—Si alloy for formation of the thin layer A,) to generate arc discharge; and then the surface of the gear cutter body becomes clear by bombardment cleaning treatment.

(c) A nitrogen gas as a reaction gas is introduced into the apparatus to create a reaction atmosphere of 3 Pa; and also a DC bias voltage of −35 to −45 V is applied to the gear cutter body, which is rotating and is placed on the turntable which is turning.

Additionally, applying a current of 100 A between an anode and an Al—Cr—Si alloy for formation of the thin layer A, an arc discharge is generated.

Thereby, a under layer having a target composition and a target thickness as shown in Table 1 is vapory deposited and formed on the surface of the high-speed steel gear cutter body. (For example, an under layer having same composition of the thin layer A or B is usable.) In case that the under layer is not to be formed, naturally the above process (c) is unnecessary.

(d) Next, a nitrogen gas as a reaction gas is introduced into the apparatus to create a reaction atmosphere of 2 Pa; and also a DC bias voltage of −25 to −35 V is applied to the gear cutter body, which is relating and is placed on the turntable which is turning. Additionally, applying a predetermined current in the range of 50 to 200 A between the anode and the cathode made of an Al—Ti—Si alloy for formation of the thin layer B, an arc discharge is generated between them.

Thereby, the thin layer B having a predetermined thickness is formed on the under layer covering the surface of the high-speed steel gear cutter body.

After forming such shin layer B, the arc discharge is stopped.

Subsequently, applying a predetermined current in the range of 50 to 200 A between the anode and a cathode made of an Al—Cr—Si alloy for formation of the thin layer A, an arc discharge is generated between them.

Thereby, the thin layer A having a predetermined thickness is formed on the thin layer B. After forming such shin layer A, the arc discharge is stopped.

(If the under layer has the same composition as the thin layer B, the formation of the thin layer A may be started firstly.)

Thereafter, the above processes for forming alternately the thin layers B and A are performed repeatedly, wherein:

the process for the formation of the thin layer B is by the arc discharge between the anode and the cathode made of an Al—Ti—Si alloy for formation of the thin layer B, and the process for the formation of the thin layer A is by the arc discharge between the anode and the cathode made of an Al—Cr—Si alloy for formation of the thin layer A. In accordance with the procedure of (a) to (d) aforementioned, coated high-speed steel gear cutters (solid hob cutter) 1 to 8 of the invention were manufactured. On the surfaces of these tools, a under layer and an upper layer are deposited. The under layer has a target composition and a target thickness shown in Table 1. The upper layer is composed of alternately laminated layers of the thin layers A and B having target compositions and target thicknesses across their thicknesses, respectively shown in Table 1.

In addition, the under layer is not provided in the coated high-speed steel gear cutters 1 and 5 of the invention.

Additionally, for the purpose of comparison, coated high-speed steel gear cutters (solid hob cutter) with a single phase structure coating layer, namely, a single layer structure coating layer, was manufactured through the following procedure.

Figure 2:
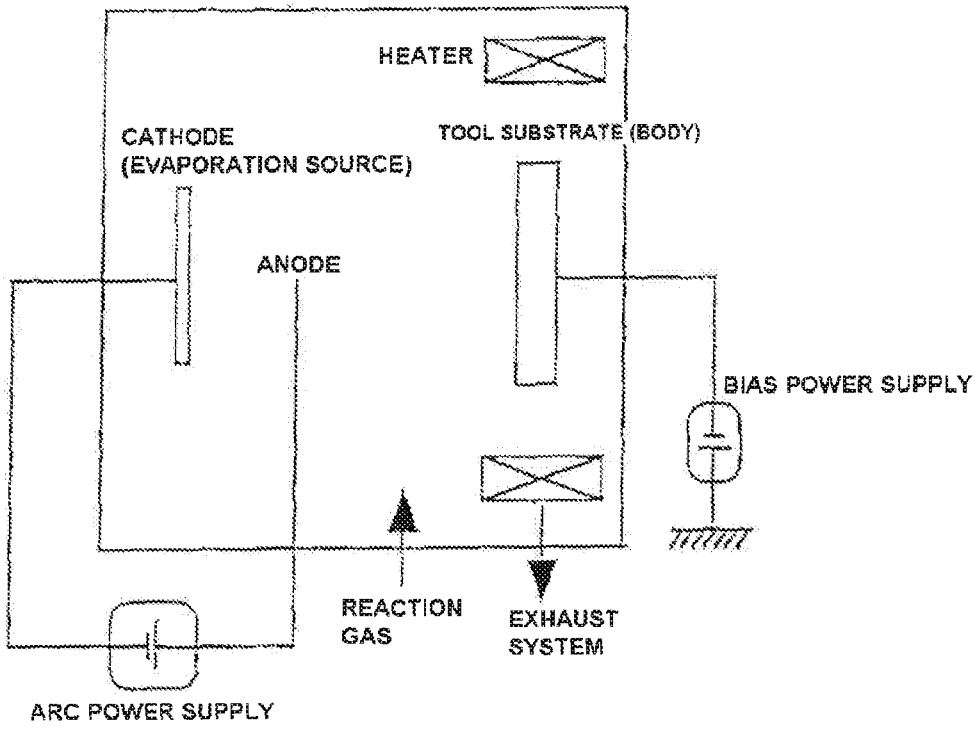
FIG. 2 is a schematic explanatory view of a conventional arc ion plating apparatus.

Each high-speed steel gear cutter body made of the aforementioned two kinds of material is cleaned by ultrasonic cleaning in acetone, and then dried. Thereafter, each body is placed into an arc ion plating apparatus shown in FIG. 2. An Al—Cr—Si alloy having a component composition corresponding to a target composition shown in Table 2 is also placed into the arc ion plating apparatus as a cathode (evaporation source). First, the inside of the apparatus is evacuated to a pressure of 0.1 Pa or less; and then keeping this pressure level, the inside of the apparatus is heated up to 400° C. with a heater.

Applying a DC bias voltage of −800 V to a gear cutter body, and also applying a current of 100 A between an anode and a cathode made of the above Al—Cr—Si alloy (or the Al—Ti—Si alloy), an arc discharge is generated; and then the surface of the gear cutter body becomes clear by bombardment cleaning treatment with the Al—Cr—Si alloy (or the Al—Ti—Si alloy).

Next, a nitrogen gas as a reaction gas is introduced into the apparatus to create a reaction atmosphere of 3 Pa, and the DC bias voltage applied to the gear cutter body is decreased in the range of −35 to −45 V; and then an arc discharge is generated between the anode and the Al—Cr—Si alloy (or the Al—Ti—Si alloy).

Thereby, coated high-speed steel gear cutters 1 to 8 with a single layer structure coating layer (hereinafter, referred to as comparative coated high-speed steel gear cutters 1 to 8) were manufactured. On the surface of these tools, a hard coating layer composed of an (Al, Cr, Si)N layer (or a hard coating layer composed of an (Al, Ti, Si)N layer) is deposited. This hard coating layer has a single layer structure with a target composition and a target thickness shown in Table 2.

Next, the performances in cutting of the above coated high-speed steel gear cutters 1 to 8 of the invention and of the above comparative coated high-speed steel gear cutters 1 to 8 were measured.

Using these tools, a workpiece made of JIS-SCr420H was machined to product a gear with the following dimensions and shapes, Module: 1.75,
Pressure angle: 17.5°,
Number of teeth: 48,
Helical angle: 25° left twist, and
Face width is 50 mm;

under the following conditions,

Cutting speed (rotating speed): 250 m/min,
Feed: 2.5 mm/rev, and
cutting type: climbing, no shifting, and air blowing.

This test was performed as a high-speed gear cutting. (In addition, the cutting speed in this test of a gear made from this workpiece is typically 200 m/min.) Until the wear width of the flank face became 0.2 mm, this cutting test was performed repeatedly; and then the number of gears machined by the sample tool was counted.

The measurement results are shown in Tables 1 and 2.

EXAMPLE 2

Figure 4:
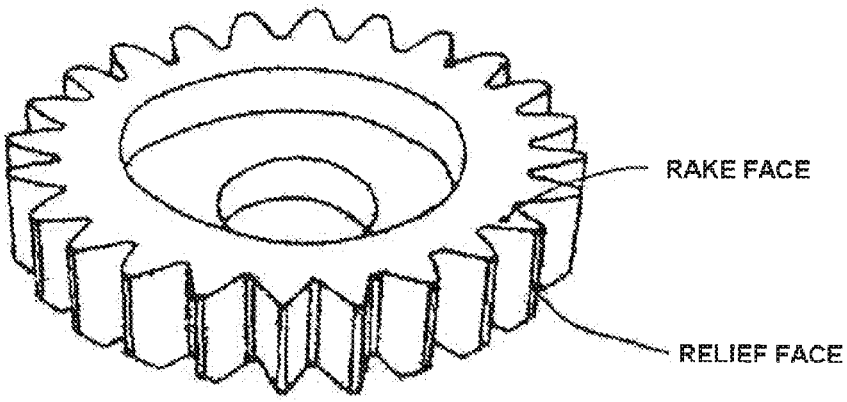
FIG. 4 is a schematic perspective view of a disc type shaper cutter.

Additionally, other high-speed steel gear cutter bodies having a related shape to a disc type shaper cutter body (100 Type described in JIS-B-4356) shown in a schematic perspective view in FIG. 4 were prepared. These bodies have a shape in which overall dimensions are Pitch circle diameter 100 mm×Thickness 18 mm and its number of cutter teeth is 50.

The material of these bodies is high-speed tool steels of JIS-SKH51 or JIS-SKH55, and has a cylindrical shape in which dimensions are Diameter 100 mm×Thickness 130 mm. By machining the material, the high-speed steel gear cutter bodies (100 Type described in JIS-B-4356) were manufactured.

The following procedure was carried on to manufacture coated high-speed steel gear cutters (shaper cutter).

The surface of each high-speed steel gear cutter body (shaper cutter) is cleaned by ultrasonic cleaning in acetone, and then dried. Thereafter, each body is placed into the arc ion plating apparatus shown in FIG. 1. Further, under the same conditions as Example 1 aforementioned, the coated high-speed steel gear cutters (shaper cutter) 9 to 16 of the invention were manufactured. On the surfaces of these tools, an under layer and an upper layer are deposited. The under layer has a target composition and a target thickness shown in Table 1. The upper layer is composed of alternately laminated layers of the thin layers A and B having target compositions and target thicknesses across their thicknesses, respectively shown in Table 1. In addition, the under layer is not provided in the coated high-speed steel gear cutters 9 and 13 of the invention.

Additionally, for the purpose of comparison, coated high-speed steel gear cutters (shaper cutter) with a single layer structure coating layer were manufactured through the following procedure.

Each surface of these high-speed steel gear cutter bodies is cleaned by ultrasonic cleaning in acetone, and then dried. Thereafter, each body is placed into an arc ion plating apparatus shown in FIG. 2. Further, under the same conditions as Example 1 aforementioned, coated high-speed steel gear cutters 9 to 16 with a single layer structure coating layer (hereinafter, referred to as comparative coated high-speed steel gear cutters 9 to 16) were manufactured.

On the surface of these tools, a hard coating layer composed of an (Al, Cr, Si)N layer (or a hard coating layer composed of an (Al, Ti, Si)N layer) is deposited. This hard coating layer has a single layer structure with a target composition and a target thickness shown in Table 2.

Next, the performances in cutting of the above coated high-speed steel gear cutters 9 to 16, and of the above comparative coated high-speed steel gear cutters 9 to 16; were measured.

Using these tools, a workpiece made of JIS-SCr420H was machined to product a gear with the following dimensions and/or shapes, Module: 2,
Pressure angle: 20°,
Number of teeth: 15, and
Face width: 22.5 mm;

under the following conditions,

Number of strokes: 1200 stroke/min,
Circumferential feed: 0.3 mm/stroke, and
Radial feed: 0.03 mm/stroke.

This test was performed as high-speed gear cutting. (In addition, the cutting speed in this test of a gear made from this workpiece is typically 800 stroke/min.)

Until the wear width of the sample tool's flank face became 0.2 mm, this cutting test was performed repeatedly; and then the number of gears machined by the sample tool was counted.

The measurement results are shown in Tables 1 and 2.

Each content ratio regarding an Al component, a Cr component, a Ti component, and a Si component as a target composition in Tables 1, 2, and 4 to 9; is shown in terms of atomic ratio.

TABLE 1

| | | | HARD COATING LAYER | | | | | | | | |
|---|---|---|---|---|---|---|---|---|---|---|---|
| | | | | | | | | UPPER LAYER/THIN LAYER-A | | | |
| | | MATERIAL | UNDER LAYER | | | | | | | | ONE-LAYER |
| | | OF BODY (SUB- | TARGET COMPOSITION (ATOMIC RATIO) | | | | TARGET LAYER THICKNESS | TARGET COMPOSITION (ATOMIC RATIO) | | | TARGET LAYER THICKNESS |
| TYPE | | STRATE) | Al | Cr | Ti | Si | (μm) | Al | Cr | Si | (nm) |
| COATED | 1 | SKH51 | — | — | — | — | — | 0.24 | 0.75 | 0.01 | 10 |
| HIGH- | 2 | SKH51 | 0.24 | 0.75 | — | 0.01 | 1 | 0.24 | 0.75 | 0.01 | 10 |
| SPEED | 3 | SKH51 | 0.47 | — | 0.50 | 0.03 | 2 | 0.45 | 0.52 | 0.03 | 30 |

TABLE 1-continued

| | | | | | | | | | | | |
|---|---|---|---|---|---|---|---|---|---|---|---|
| STEEL | 4 | SKH51 | 0.42 | 0.52 | — | 0.06 | 3.5 | 0.42 | 0.52 | 0.06 | 50 |
| GEAR | 5 | SKH55 | — | — | — | — | — | 0.43 | 0.49 | 0.08 | 50 |
| CUTTING | 6 | SKH55 | 0.53 | — | 0.40 | 0.07 | 5 | 0.43 | 0.49 | 0.08 | 50 |
| TOOL OF | 7 | SKH55 | 0.20 | 0.60 | — | 0.20 | 7 | 0.20 | 0.60 | 0.20 | 70 |
| THE | 8 | SKH55 | 0.15 | — | 0.80 | 0.05 | 10 | 0.30 | 0.65 | 0.05 | 100 |
| INVEN- | 9 | SKH51 | — | — | — | — | — | 0.35 | 0.55 | 0.10 | 70 |
| TION | 10 | SKH51 | 0.35 | 0.55 | — | 0.10 | 4 | 0.35 | 0.55 | 0.10 | 70 |
| | 11 | SKH51 | 0.55 | — | 0.40 | 0.05 | 2 | 0.45 | 0.45 | 0.10 | 40 |
| | 12 | SKH51 | 0.45 | 0.40 | — | 0.15 | 1 | 0.45 | 0.40 | 0.15 | 60 |
| | 13 | SKH55 | — | — | — | — | — | 0.20 | 0.75 | 0.05 | 80 |
| | 14 | SKH55 | 0.05 | — | 0.94 | 0.01 | 10 | 0.20 | 0.75 | 0.05 | 80 |
| | 15 | SKH55 | 0.30 | 0.55 | — | 0.15 | 7 | 0.30 | 0.55 | 0.15 | 100 |
| | 16 | SKH55 | 0.35 | — | 0.63 | 0.02 | 5 | 0.40 | 0.45 | 0.15 | 20 |

| | | HARD COATING LAYER | | | | | |
|---|---|---|---|---|---|---|---|
| | | UPPER LAYER/THIN LAYER B | | | | | |
| | | TARGET COMPOSITION (ATOMIC RATIO) | | | ONE-LAYER TARGET LAYER THICKNESS | UPPER LAYER TOTAL TARGET LAYER THICKNESS | NUMBER OF MACHINED |
| TYPE | | Al | Ti | Si | (NM) | (μm) | GEAR |
| COATED | 1 | 0.75 | 0.24 | 0.01 | 20 | 1 | 90 |
| HIGH- | 2 | 0.75 | 0.24 | 0.01 | 20 | 1 | 100 |
| SPEED | 3 | 0.47 | 0.50 | 0.03 | 50 | 5 | 110 |
| STEEL | 4 | 0.50 | 0.45 | 0.05 | 70 | 1.5 | 115 |
| GEAR | 5 | 0.53 | 0.40 | 0.07 | 30 | 3 | 95 |
| CUTTING | 6 | 0.53 | 0.40 | 0.07 | 30 | 3 | 110 |
| TOOL OF | 7 | 0.05 | 0.85 | 0.10 | 40 | 10 | 100 |
| THE | 8 | 0.15 | 0.80 | 0.05 | 80 | 5 | 105 |
| INVEN- | 9 | 0.45 | 0.48 | 0.07 | 50 | 2 | 95 |
| TION | 10 | 0.45 | 0.48 | 0.07 | 50 | 2 | 110 |
| | 11 | 0.55 | 0.40 | 0.05 | 10 | 6 | 110 |
| | 12 | 0.75 | 0.15 | 0.10 | 100 | 7 | 100 |
| | 13 | 0.05 | 0.94 | 0.01 | 90 | 3 | 90 |
| | 14 | 0.05 | 0.94 | 0.01 | 90 | 3 | 100 |
| | 15 | 0.70 | 0.25 | 0.05 | 60 | 1 | 105 |
| | 16 | 0.35 | 0.63 | 0.02 | 10 | 4 | 105 |

TABLE 2

| | | | HARD COATING LAYER | | | | | |
|---|---|---|---|---|---|---|---|---|
| | | MATERIAL OF BODY | TARGET COMPOSITION (ATOMIC RATIO) | | | | TARGET LAYER THICKNESS | NUMBER OF MACHINED |
| TYPE | | (SUBSTRATE) | Al | Cr | Ti | Si | (μm) | GEAR |
| COMPARATIVE | 1 | SKH51 | 0.75 | — | 0.24 | 0.01 | 1 | 20 |
| HIGH-SPEED | 2 | SKH51 | 0.24 | 0.75 | — | 0.01 | 2 | 25 |
| STEEL | 3 | SKH51 | 0.47 | — | 0.50 | 0.03 | 7 | 35 |
| GEAR | 4 | SKH51 | 0.42 | 0.52 | — | 0.06 | 5 | 40 |
| CUTTING | 5 | SKH55 | 0.43 | 0.49 | — | 0.08 | 3 | 22 |
| TOOL | 6 | SKH55 | 0.53 | — | 0.40 | 0.07 | 8 | 30 |
| | 7 | SKH55 | 0.20 | 0.60 | — | 0.20 | 17 | 25 |
| | 8 | SKH55 | 0.15 | — | 0.80 | 0.05 | 15 | 30 |
| | 9 | SKH51 | 0.45 | — | 0.48 | 0.07 | 2 | 22 |
| | 10 | SKH51 | 0.35 | 0.55 | — | 0.10 | 6 | 40 |
| | 11 | SKH51 | 0.55 | — | 0.40 | 0.05 | 8 | 35 |
| | 12 | SKH51 | 0.45 | 0.40 | — | 0.15 | 8 | 35 |
| | 13 | SKH55 | 0.20 | 0.75 | — | 0.05 | 3 | 20 |
| | 14 | SKH55 | 0.05 | — | 0.94 | 0.01 | 13 | 25 |
| | 15 | SKH55 | 0.30 | 0.55 | — | 0.15 | 8 | 33 |
| | 16 | SKH55 | 0.35 | — | 0.63 | 0.02 | 9 | 28 |

The compositions of the layers, namely, the under layer, the thin layer A, and the thin layer B, which constitute the hard coating layer of the coated high-speed steel gear cutters 1 to 16 of the invention and the compositions of the hard coating layers of the comparative coated high-speed steel gear cutters 1 to 16 were measured by an energy dispersive X-ray analysis method using a transmission electron microscope. The results of this measurement show that each layer has a substantially same composition as its target composition respectively.

Additionally, the thickness of each layer constituting the above hard coating layer was section-measured by the transmission electron microscope. The results of this measurement show that each layer has an average thickness (average of five points) which is substantially same thickness as its target thickness.

The results in Tables 1 and 2 show clearly the following subjects.

The hard coating layer of each of the coated high-speed steel gear cutters of the invention is constituted by the alternately laminated layer of the thin layer A and the thin layer B, and/or the under layer;

has excellent high-temperature hardness and thermoplastic deformation resistance, and has also excellent high-temperature toughness and high-temperature strength.

Therefore, even in the cutting performed under the high-speed gear cutting conditions in which high temperature is generated, and a large impact and/or mechanical load is applied; the hard coating layer can exhibit its excellent wear resistance without the occurrence of chipping or fractures.

On the other hand, if a comparative coated high-speed steel gear cutter, on which a hard coating layer composed of an (Al, Cr, Si)N layer (or a hard coating layer composed of an (Al, Ti, Si)N layer) having a single layer structure is formed, is used under the above high-speed gear cutting conditions; such tool's insufficient toughness will cause fractures or chipping. Also, such tool's poor wear resistance makes its tool life relatively short period.

EXAMPLE 3

As the first step, the following procedure was carried on to manufacture cemented carbide end mills.

Material powders, a medium coarse-grained WC powder having an average grain size of 5.5 μm, a fine-grained WC powder having an average grain size of 0.8 μm, a TaC powder having an average grain size of 1.3 μm, an NbC powder having an average grain size of 1.2 μm, a ZrC powder having an average grain size of 1.2 μm, a $Cr_3C_2$ powder having an average grain size of 2.3 μm, a VC powder having an average grain size of 1.5 μm, a (Ti, W)C [TiC/WC=50/50 in a mass ratio] having an average grain size of 1.0 μm, and a Co powder having an average grain size of 1.8 μm;

are prepared as raw powders for the cemented carbide end mills.

These raw powders are blended in accordance with a blending composition shown in Table 3. After adding wax to the blended raw powders, the blended raw powders are well mixed in acetone for 24 hours by a ball mill, and then dried in a decompression atmosphere.

Thereafter, the mixed powders are pressed with a pressure of 100 MPa to form various green compacts having a predetermined shape.

In a vacuum atmosphere of 6 Pa, these green compacts are heated up gradually at a temperature rising rate of 7° C./min to a predetermined temperature in the range of 1370 to 1470° C. After keeping this temperature for one hour, these green compacts are sintered under the condition of furnace cooling.

Therefore, three types of sintered compact for the formation of cemented carbide substrates are formed. These sintered compacts have round bar shapes with diameters 8 mm, 13 mm, and 26 mm, respectively. Further, by grinding these three types of round bar sintered compacts, cemented carbide end mills 1 to 11 made of a WC-based cemented carbide alloy were manufactured.

These end mills 1 to 11 have a four-flute square shape with a helix angle of 30°, and their dimensions in which a diameter×length are 6 mm×13 mm, 10 mm×22 mm, or 20 mm×45 mm respectively. Table 3 also shows the combinations of the diameter×length and the blending composition.

Next, the following procedure was carried on, to form a coating layer on the above cemented carbide end mills.

The surfaces of these cemented carbide end mills 1 to 11 are cleaned by ultrasonic cleaning in acetone, and then dried. Thereafter, these end mills are placed into the arc ion plating apparatus shown in FIG. 1. Under the same conditions as Example 1 aforementioned, surface-coated cemented carbide end mills 1 to 11 (hereinafter referred to as coated cemented carbide end mills 1 to 11 of the invention) were manufactured, as the surface-coated cutting tools of the invention. On the surfaces of these end mills, a under layer and an upper layer are deposited. The under layer has a target composition and a target thickness shown in Table 4. The upper layer is composed of alternately laminated layers of the thin layers A and B having target compositions and target thicknesses across their thicknesses, respectively shown in Table 4.

In addition, the under layer is not provided in the surface-coated cemented carbide end mills 1, 5, and 9 of the invention.

Additionally, for the purpose of comparison, comparative surface-coated cemented carbide end mills with a single layer structure coating layer (hereinafter referred to as comparative coated cemented carbide end mills) were manufactured through the following procedure.

The surfaces of the above cemented carbide end mills 1 to 11 are cleaned by ultrasonic cleaning in acetone, and then dried. Thereafter, the end mills are placed into an arc ion plating apparatus shown in FIG. 2. Under the same conditions as Example 1 aforementioned, the comparative coated cemented carbide end mills 1 to 11 having a hard coating layer were manufactured. The hard coating layer has a single layer structure with a target composition and a target thickness respectively shown in Table 5.

(a) Next, the performances in cutting of the above coated cemented carbide end mills 1 to 11 of the invention, and of the above comparative coated cemented carbide end mills 1 to 11 were evaluated with a condition mentioned in the below (a1), (a2) or (a3).

(a1) For the coated cemented carbide end mills 1 to 4 of the invention and the comparative coated cemented carbide end mills 1 to 4, a cutting test, in which these end mills try to machine a die steel as a workpiece, was carried out under the following conditions, Cutting speed: 150 m/min, Depth of slot (depth of cut): 1.0 mm, and Table feed: 1000 mm/min.

Additionally, the workpiece is a plate of JIS-SKD61 with the following dimensions, Plane: 100 mm×250 mm and Thickness: 50 mm.

This cutting test was performed as a dry high-speed slot milling of die steel. (Typical cutting speed of this cutting is 120 m/min.)

(a2) For the coated cemented carbide end mills 5 to 8 of the invention and the comparative coated cemented carbide end mills 5 to 8, a cutting test, in which these end mills try to machine an alloy steel as a workpiece, was carried out under the following conditions, Cutting speed: 160 m/min, Depth of slot (depth of cut): 1.0 mm, and Table feed: 1200 mm/min.

Additionally, the workpiece is a plate of JIS-SCM440 with the following dimensions, Plane: 100 mm×250 mm and Thickness: 50 mm.

This cutting test was performed as a dry high-speed slot milling of alloy steel. (Typical cutting speed of tins cutting is 100 m/min.)

(a3) For the coated cemented carbide end mills 9 to 11 of the invention and the comparative coated cemented carbide end mills 9 to 11, a cutting test, in which these end mills try to machine a cold-die steel as a workpiece, was carried out under the following conditions, Cutting speed: 100 m/min, Depth of slot (depth of cut): 1.0 mm, and Table feed: 600 mm/min, Additionally, the workpiece is a plate of JIS-SKD11 with the following dimensions, Plane: 100 mm×250 mm and Thickness: 50 mm.

This cutting test was performed as a dry high-speed slot milling of cold-die steel.

(Typical cutting speed of this cutting is 50 m/min.)

Each slot milling test mentioned in the above (a1), (a2) or (a3) was performed repeatedly until the wear width of a flank face of the sample end mill became 0.1 mm. Then the length of slot, which the sample end mill has cut, was measured. The flank face is located at a peripheral cutting edge of a cutting edge portion. This 0.1 mm is a standard of end mil's life for judging whether an end mill is usable or not. The test results are shown in Tables 4 and 5.

TABLE 3

| TYPE | SYMBOL OF BODY (SUB-STRATE) | BLENDING COMPOSITION (MASS %) Co | (Ti, W)C | TaC | NbC | ZrC | $Cr_3C_2$ | VC | WC | DIAMETER × LENGTH OF CUTTING EDGE PORTION (mm) |
|---|---|---|---|---|---|---|---|---|---|---|
| RAW POWDER FOR CEMENTED CARBIDE END MILL | (A) | 5 | 5 | — | — | — | — | — | MEDIUM COARSE GRAIN: REMAINDER | 6 × 13 |
| | (B) | 6 | — | 1 | 0.5 | — | — | — | FINE GRAIN: REMAINDER | 6 × 13 |
| | (C) | 6 | — | 1 | — | 1 | 0.5 | 0.5 | FINE GRAIN: REMAINDER | 6 × 13 |
| | (D) | 8 | — | — | — | — | 0.5 | 0.5 | FINE GRAIN: REMAINDER | 10 × 22 |
| | (E) | 9 | 25 | 10 | 1 | — | — | — | MEDIUM COARSE GRAIN: REMAINDER | 10 × 22 |
| | (F) | 10 | — | — | — | — | 1 | — | FINE GRAIN: REMAINDER | 10 × 22 |
| | (G) | 12 | 17 | 9 | 1 | — | — | — | MEDIUM COARSE GRAIN: REMAINDER | 20 × 45 |
| | (H) | 16 | — | 10 | 5 | 10 | — | 13 | MEDIUM COARSE GRAIN: REMAINDER | 20 × 45 |

TABLE 4

| TYPE | | SYMBOL OF BODY (SUB-STRATE) | HARD COATING LAYER: UNDER LAYER: TARGET COMPOSITION (ATOMIC RATIO) Al | Cr | Ti | Si | TARGET LAYER THICKNESS (μm) | UPPER LAYER/THIN LAYER A: TARGET COMPOSITION (ATOMIC RATIO) Al | Cr | Si | ONE-LAYER TARGET LAYER THICKNESS (nm) |
|---|---|---|---|---|---|---|---|---|---|---|---|
| COATED CEMENTED CARBIDE END MILL OF THE INVENTION | 1 | (A) | — | — | — | — | — | 0.35 | 0.55 | 0.10 | 10 |
| | 2 | (A) | 0.35 | 0.55 | — | 0.10 | 1 | 0.35 | 0.55 | 0.10 | 10 |
| | 3 | (B) | 0.45 | — | 0.48 | 0.07 | 2 | 0.45 | 0.52 | 0.03 | 30 |
| | 4 | (C) | 0.05 | — | 0.94 | 0.01 | 6 | 0.20 | 0.75 | 0.05 | 90 |
| | 5 | (D) | — | — | — | — | — | 0.42 | 0.52 | 0.06 | 50 |
| | 6 | (D) | 0.42 | 0.52 | — | 0.06 | 3.5 | 0.42 | 0.52 | 0.06 | 50 |
| | 7 | (E) | 0.15 | — | 0.80 | 0.05 | 5 | 0.30 | 0.65 | 0.05 | 50 |
| | 8 | (F) | 0.40 | 0.45 | — | 0.15 | 7 | 0.40 | 0.45 | 0.15 | 70 |
| | 9 | (G) | — | — | — | — | — | 0.45 | 0.45 | 0.10 | 40 |

TABLE 4-continued

| | | | | | | | | | | |
|---|---|---|---|---|---|---|---|---|---|---|
| 10 | (G) | 0.45 | 0.45 | — | 0.10 | 4 | 0.45 | 0.45 | 0.10 | 40 |
| 11 | (H) | 0.75 | — | 0.15 | 0.10 | 10 | 0.45 | 0.40 | 0.15 | 100 |

| | | HARD COATING LAYER | | | | | |
|---|---|---|---|---|---|---|---|
| | | UPPER LAYER/ THIN LAYER B | | | | UPPER LAYER | |
| | | TARGET COMPOSITION (ATOMIC RATIO) | | | ONE-LAYER TARGET LAYER THICKNESS | TOTAL TARGET LAYER THICKNESS | LENGTH OF SLOT |
| TYPE | | Al | Ti | Si | (nm) | (μm) | (m) |
| COATED CEMENTED CARBIDE END MILL OF THE INVENTION | 1 | 0.47 | 0.50 | 0.03 | 20 | 1 | 85 |
| | 2 | 0.47 | 0.50 | 0.03 | 20 | 1 | 98 |
| | 3 | 0.45 | 0.48 | 0.07 | 50 | 5 | 100 |
| | 4 | 0.05 | 0.94 | 0.01 | 60 | 8 | 93 |
| | 5 | 0.50 | 0.45 | 0.05 | 70 | 1.5 | 90 |
| | 6 | 0.50 | 0.45 | 0.05 | 70 | 1.5 | 105 |
| | 7 | 0.15 | 0.80 | 0.05 | 30 | 3 | 95 |
| | 8 | 0.35 | 0.63 | 0.02 | 40 | 10 | 94 |
| | 9 | 0.55 | 0.40 | 0.05 | 30 | 4 | 88 |
| | 10 | 0.55 | 0.40 | 0.05 | 30 | 4 | 103 |
| | 11 | 0.75 | 0.15 | 0.10 | 80 | 5 | 92 |

TABLE 5

| | | SYMBOL | HARD COATING LAYER | | | | | |
|---|---|---|---|---|---|---|---|---|
| | | OF BODY (SUB- | TARGET COMPOSITION (ATOMIC RATIO) | | | | TARGET LAYER THICKNESS | LENGTH OF SLOT |
| TYPE | | STRATE) | Al | Cr | Ti | Si | (μm) | (m) |
| COMPARATIVE COATED CEMENTED CARBIDE END MILL | 1 | (A) | 0.47 | — | 0.50 | 0.03 | 1 | 28 |
| | 2 | (A) | 0.35 | 0.55 | — | 0.10 | 2 | 35 |
| | 3 | (B) | 0.45 | — | 0.48 | 0.07 | 7 | 40 |
| | 4 | (C) | 0.05 | — | 0.94 | 0.01 | 14 | 32 |
| | 5 | (D) | 0.50 | — | 0.45 | 0.05 | 1.5 | 31 |
| | 6 | (D) | 0.42 | 0.52 | — | 0.06 | 5 | 38 |
| | 7 | (E) | 0.15 | — | 0.80 | 0.05 | 8 | 33 |
| | 8 | (F) | 0.40 | 0.45 | — | 0.15 | 17 | 32 |
| | 9 | (G) | 0.55 | — | 0.40 | 0.05 | 4 | 30 |
| | 10 | (G) | 0.45 | 0.45 | — | 0.10 | 8 | 36 |
| | 11 | (H) | 0.75 | — | 0.15 | 0.10 | 15 | 34 |

EXAMPLE 4

Round bar materials made of high-speed tool steel (JIS-SKH55) with three different dimensions, namely, the diameter is 8 mm, 13 mm, or 26 mm, were prepared. By machining these three types of round bar materials, high-speed steel end mills 1 to 9 were manufactured. These end mills 1 to 9 have a four-flute square shape with a helix angle of 30°, and cutting edges of them have a dimension in which its diameter×length is 6 mm×13 mm, 10 mm×22 mm, or 20 mm×45 mm.

In addition, the dimensions and shapes of these high-speed steel end mills 1 to 3, 4 to 6, and 7 to 9 are the same as those of the cemented carbide end mills 1 to 4, 5 to 8, 9 to 11 described in Example 3, respectively.

Next, the following procedure was carried on, to form a coating layer on the above high-speed steel end mills.

The surfaces of these high-speed steel end mills 1 to 9 are cleaned by ultrasonic cleaning in acetone, and then dried. Thereafter, these end mills are placed into the arc ion plating apparatus shown in FIG. 1. Under the same conditions as Example 1 aforementioned, surface-coated high-speed steel end mills (hereinafter referred to as coated high-speed steel end mills of the invention) 1 to 9 were manufactured, as the surface-coated cutting tools of the invention. On the surfaces of these end mills, a under layer and an upper layer are deposited. The under layer has a target composition and a target thickness shown in Table 6. The upper layer is composed of alternately laminated layers of the thin layers A and B having target compositions and target thicknesses across their thicknesses, respectively shown in Table 6.

In addition, the under layer is not provided in the coated high-speed steel end mills 1, 4, and 7 of the invention.

Additionally, for the purpose of comparison, comparative surface-coated high-speed steel end mills with a single layer structure coating layer (hereinafter referred to as comparative coated high-speed steel end mills) were manufactured through the following procedure.

The surfaces of the above coated high-speed steel end mills 1 to 8 are cleaned by ultrasonic cleaning in acetone, and then dried. Thereafter, the end mills are placed into the arc ion plating apparatus shown in FIG. 2. Under the same conditions as Example 1 aforementioned, the comparative coated high-speed steel end mills 1 to 9 having a hard coating layer was manufactured. The hard coating layer has a single layer structure with a target composition and a target thickness respectively shown in Table 7.

(b) Next, the performances in cutting of the above coated high-speed steel end mills 1 to 9 of the invention and the above comparative coated high-speed steel end mills 1 to 9 were evaluated with a condition mentioned in the below (b1), (b2) or (b3).

(b1) For the coated high-speed steel end mills 1 to 3 of the invention and the comparative coated high-speed steel end mills 1 to 3, a cutting test, in which these end mills try to machine a carbon steel as a workpiece, was carried out under the following conditions, Cutting speed: 60 m/min, Depth of slot (depth of cut): 6 mm, and Table feed: 400 mm/min.

Additionally, the workpiece is a plate of JIS-S55C with the following dimensions, Plane: 100 mm×250 mm and Thickness: 50 mm.

This cutting test was performed as a dry high-speed slot milling of carbon steel. (Typical cutting speed of this cutting is 30 m/min.)

(b2) For the coated high-speed steel end mills 4 to 6 of the invention and the comparative coated high-speed steel end mills 4 to 6, a cutting test, in which these end mills try to machine a die steel as a workpiece, was carried out under the following conditions, Cutting speed: 50 m/min, Depth of slot (depth of cut): 10 mm, and Table feed: 400 mm/min.

Additionally, the workpiece is a plate of JIS-SKD61 with the following dimensions, Plane: 100 mm×250 mm and Thickness: 50 mm.

This cutting test was performed as a dry high-speed slot milling of die steel. (Typical cutting speed of this cutting is 25 m/min.)

(b3) For the coated high-speed steel end mills 7 to 9 of the invention and the comparative coated high-speed steel end mills 7 to 9, a cutting test, in which these end mills try to machine an alloy steel as a workpiece, was carried out under the following conditions, Cutting speed: 50 m/min, Depth of slot (depth of cut): 20 mm, and Table feed: 350 mm/min.

Additionally, the workpiece is a plate of JIS-SCM440 with the following dimensions, Plane: 100 mm×250 mm and Thickness: 50 mm.

This cutting test was performed as a dry high-speed slot milling of alloy steel. (Typical cutting speed of this cutting is 25 m/min.)

Each slot milling test mentioned in the above (b1), (b2) or (b3) was performed repeatedly until the wear width of a flank face of the sample end mill became 0.1 mm. Then the length of slot, which the sample end mill has cut, was measured. The flank face is located at a peripheral cutting edge of a cutting edge portion. This 0.1 mm is a standard of end mill's life for judging whether an end mill is usable or not. The test results are shown in Tables 6 and 7.

TABLE 6

| | | | HARD COATING LAYER | | | | | | | | |
|---|---|---|---|---|---|---|---|---|---|---|---|
| | | | | | | | | UPPER LAYER/THIN LAYER A | | | |
| | | | UNDER LAYER | | | | | | | | ONE-LAYER |
| | | SYMBOL OF | TARGET COMPOSITION (ATOMIC RATIO) | | | | TARGET LAYER THICKNESS | TARGET COMPOSITION (ATOMIC RATIO) | | | TARGET LAYER THICKNESS |
| TYPE | | BODY | Al | Cr | Ti | Si | (μm) | Al | Cr | Si | (nm) |
| COATED | 1 | (A) | — | — | — | — | — | 0.35 | 0.55 | 0.10 | 70 |
| HIGH SPEED | 2 | (B) | 0.35 | 0.55 | — | 0.10 | 4 | 0.35 | 0.55 | 0.10 | 70 |
| STEEL | 3 | (C) | 0.15 | — | 0.80 | 0.05 | 10 | 0.30 | 0.65 | 0.05 | 80 |
| END MILL | 4 | (D) | — | — | — | — | — | 0.40 | 0.45 | 0.15 | 60 |
| OF THE | 5 | (E) | 0.40 | 0.45 | — | 0.15 | 1 | 0.40 | 0.45 | 0.15 | 60 |
| INVENTION | 6 | (F) | 0.45 | — | 0.48 | 0.07 | 2 | 0.45 | 0.52 | 0.03 | 40 |
| | 7 | (G) | — | — | — | — | — | 0.45 | 0.45 | 0.10 | 100 |
| | 8 | (G) | 0.45 | 0.45 | — | 0.10 | 7 | 0.45 | 0.45 | 0.10 | 100 |
| | 9 | (H) | 0.05 | — | 0.94 | 0.01 | 5 | 0.20 | 0.75 | 0.05 | 20 |

| | | HARD COATING LAYER | | | | | |
|---|---|---|---|---|---|---|---|
| | | UPPER LAYER/THIN LAYER B | | | | UPPER LAYER | |
| | | TARGET COMPOSITION (ATOMIC RATIO) | | | ONE-LAYER TARGET LAYER THICKNESS | TOTAL TARGET LAYER THICKNESS | LENGTH OF SLOT |
| TYPE | | Al | Ti | Si | (nm) | (μm) | (m) |
| COATED | 1 | 0.47 | 0.50 | 0.03 | 50 | 2 | 20 |
| HIGH SPEED | 2 | 0.47 | 0.05 | 0.03 | 50 | 2 | 35 |
| STEEL | 3 | 0.15 | 0.80 | 0.05 | 90 | 3 | 25 |
| END MILL | 4 | 0.35 | 0.63 | 0.02 | 100 | 7 | 18 |

TABLE 6-continued

| | | | | | | | |
|---|---|---|---|---|---|---|---|
| OF THE | 5 | 0.35 | 0.63 | 0.02 | 100 | 7 | 28 |
| INVENTION | 6 | 0.45 | 0.48 | 0.07 | 10 | 6 | 30 |
| | 7 | 0.55 | 0.40 | 0.05 | 60 | 1 | 20 |
| | 8 | 0.55 | 0.40 | 0.05 | 60 | 1 | 26 |
| | 9 | 0.05 | 0.94 | 0.01 | 10 | 4 | 23 |

TABLE 7

| | | | HARD COATING LAYER | | | | | |
|---|---|---|---|---|---|---|---|---|
| | | SYMBOL OF | TARGET COMPOSITION (ATOMIC RATIO) | | | | TARGET LAYER THICKNESS | LENGTH OF SLOT |
| TYPE | | BODY | Al | Cr | Ti | Si | (μm) | (m) |
| COMPARATIVE | 1 | (A) | 0.47 | — | 0.50 | 0.03 | 2 | 6 |
| COATED | 2 | (B) | 0.35 | 0.55 | — | 0.10 | 6 | 10 |
| HIGH-SPEED | 3 | (C) | 0.15 | — | 0.80 | 0.05 | 13 | 8 |
| STEEL | 4 | (D) | 0.35 | — | 0.63 | 0.02 | 7 | 5.5 |
| END MILL | 5 | (E) | 0.40 | 0.45 | — | 0.15 | 8 | 8 |
| | 6 | (F) | 0.45 | — | 0.48 | 0.07 | 8 | 9.5 |
| | 7 | (G) | 0.55 | — | 0.40 | 0.05 | 1 | 6 |
| | 8 | (G) | 0.45 | 0.45 | — | 0.10 | 8 | 7.5 |
| | 9 | (H) | 0.05 | — | 0.94 | 0.01 | 9 | 7 |

The compositions of the layers, namely, the under layer and the upper layer composed of an alternately laminated layer structure of the thin layers A and B, which constitute the hard coating layer of the coated cemented carbide end mills 1 to 11 of the invention and the coated high-speed steel end mills 1 to 9 of the invention in Examples 3 and 4; also the composition of the hard coating layer of the comparative coated cemented carbide end mills 1 to 11 and the comparative coated high-speed steel end mills 1 to 9; were measured by an energy dispersive X-ray analysis method using a transmission electron microscope.

The results of this measurement show that each layer has a substantially same composition as its target composition respectively.

Additionally, the thickness of each layer constituting the above hard coating layer was section-measured by the transmission electron microscope. The results of this measurement show that each layer has an average thickness (average of five points) which is substantially same thickness as its target thickness.

The results in Tables 4 to 7 show clearly the following facts.

The hard coating layer of the coated cemented carbide end mills of the invention and the coated high-speed steel end mills of the invention

- is constituted by the alternately laminated layer of the thin layer A and the thin layer B, and/or the under layer;
- has excellent high-temperature hardness and thermoplastic deformation resistance, and
- has also excellent high-temperature toughness and high-temperature strength.

Therefore, even in the cutting performed under the high-speed milling conditions in which high temperature is generated, and a large impact and/or mechanical load is applied, the hard coating layer can exhibit its excellent wear resistance without the occurrence of chipping or fractures.

On the other hand, if a comparative coated cemented carbide end mill and a comparative coated high-speed end mill, on which a hard coating layer composed of an (Al, Cr, Si)N layer (or a hard coating layer composed of an (Al, Ti, Si)N layer) having a single layer structure is formed, is used under the above high-speed milling conditions; such end mill's insufficient toughness causes fractures or chipping. Also, such end mill's poor wear resistance makes its usable life time relatively short period.

EXAMPLE 5

As the first step, three types of sintered compacts produced in the above Example 3 having round bar shapes with diameters 6 mm body symbols (A) to (C) of raw powders for cemented carbide end mills), 10 mm body symbols (D) to (F) of raw powders for cemented carbide end mills), or 20 mm body symbols (G) and (H) of raw powders for cemented carbide end mills) were prepared. By grinding these three types of round bar sintered compacts, cemented carbide drills 1 to 11 made of a WC-based cemented carbide alloy were manufactured.

These drills 1 to 11 have a two-flute shape with a helix angle of 30°, and web sections of them have a dimension in which a diameter×length is 4 mm×13 mm for the drills 1 to 4, 10 mm×22 mm for the drills 5 to 8, or 20 mm×45 mm for the drills 9 to 11.

Next, after a honing process was performed on the cutting edges of these cemented carbide drills 1 to 11; they were also cleaned by ultrasonic cleaning in acetone, and then dried. Thereafter, these drills were placed into the arc ion plating apparatus shown in FIG. 1. Under the same conditions as Example 1 aforementioned, surface-coated cemented carbide drills 1 to 11 (hereinafter referred to as coated cemented carbide drills 1 to 11 of the invention) were manufactured. On the surfaces of these drills, a under layer and an upper layer are deposited. The under layer has a target composition and a target thickness shown in Table 8. The upper layer is composed of alternately laminated layers of the thin layers A and B having target compositions and target thicknesses across their thicknesses, respectively shown in Table 8.

In addition, the under layer is not provided in the surface-coated cemented carbide end mills 1, 5, and 9 of the invention.

Additionally, for the purpose of comparison, comparative surface-coated cemented carbide drills with a single layer structure coating layer (hereinafter referred to as comparative coated cemented carbide drills) were manufactured through the following procedure.

A honing process is performed on the cutting edge of the above cemented carbide drills 1 to 11. They are also cleaned by ultrasonic cleaning in acetone, and then dried. Thereafter, each drill is placed into the arc ion plating apparatus shown in FIG. 2. Under the same conditions as Example 1 aforementioned, the comparative surface-coated cemented carbide drills 1 to 11 having a hard coating layer was manufactured. The hard coating layer has a single layer structure with a target composition and a target thickness respectively shown in Table 9.

(c) Next, the performances in drilling of the above coated cemented carbide drills 1 to 11 of the invention and the above comparative coated cemented carbide drills 1 to 11 were measured with a condition mentioned in the below (c1), (c2) or (c3).

(c1) For the coated cemented carbide drills 1 to 4 of the invention and for the comparative coated cemented carbide drills 1 to 4, a cutting test, in which these drills try to machine an alloy tool steel for hot die as a workpiece, was carried out under the following conditions, Cutting speed: 50 m/min, Feed: 0.18 mm/rev, and Hole depth: 10 mm.

Additionally, the workpiece is a plate of JIS-SKD61 with the following dimensions, Plane: 100 mm×250 mm and Thickness: 50 mm.

This cutting test was performed as a wet high-speed drilling of alloy tool steel for hot die.

(Typical cutting speed of this cutting is 35 m/min.)

(c2) For the coated cemented carbide drills 5 to 8 of the invention and for the comparative coated cemented carbide drills 5 to 8, a cutting test, in which these drills try to machine a chromium-molybdenum steel as a workpiece, was carried out under the following conditions, Cutting speed: 85 m/min, Feed: 0.3 mm/rev, and Hole depth: 20 mm.

Additionally, the workpiece is a plate of JIS-SCM440 with the following dimensions, Plane: 100 mm×250 mm and Thickness: 50 mm.

This cutting test was performed as a wet high-speed drilling of chromium-molybdenum steel. (Typical cutting speed of this cutting is 60 m/min.)

(c3) For the coated cemented carbide drills 9 to 11 of the invention and for the comparative coated cemented carbide drills 9 to 11, a cutting test, in which these drills try to machine a carbon steel for mechanical structure as a workpiece, was carried out under the following conditions, Cutting speed: 110 m/min, Feed: 0.3 mm/rev, and Hole depth: 40 mm.

Additionally, the workpiece is a plate of JIS-S55C with the following dimensions, Plane: 100 mm×250 mm and Thickness: 50 mm.

This cutting test was performed as a wet high-speed drilling of carbon steel for mechanical structure. (Typical cutting speed of this cutting is 80 m/min.)

Until the wear width of a flank face at a tip cutting edge face of the sample drill became 0.2 mm, each wet high-speed drilling test mentioned in the above (c1), (c2) or (c3) was performed repeatedly; and then the number of holes bored by the sample drill was counted. The test results are shown in Tables 8 and 9.

TABLE 8

| | | | HARD COATING LAYER | | | | | | | | |
|---|---|---|---|---|---|---|---|---|---|---|---|
| | | | | | | | | UPPER LAYER/THIN LAYER A | | | |
| | | | UNDER LAYER | | | | | TARGET | | | ONE-LAYER |
| | | SYMBOL OF | TARGET COMPOSITION (ATOMIC RATIO) | | | | TARGET LAYER THICKNESS | COMPOSITION (ATOMIC RATIO) | | | TARGET LAYER THICKNESS |
| TYPE | | BODY | Al | Cr | Ti | Si | (μm) | Al | Cr | Si | (nm) |
| COATED | 1 | (A) | — | — | — | — | — | 0.35 | 0.55 | 0.10 | 10 |
| CEMENTED | 2 | (A) | 0.35 | 0.55 | — | 0.10 | 1 | 0.35 | 0.55 | 0.10 | 10 |
| CARBIDE | 3 | (B) | 0.45 | — | 0.48 | 0.07 | 2 | 0.45 | 0.52 | 0.03 | 30 |
| DRILL | 4 | (C) | 0.05 | — | 0.94 | 0.01 | 6 | 0.20 | 0.75 | 0.05 | 90 |
| OF THE | 5 | (D) | — | — | — | — | — | 0.42 | 0.52 | 0.06 | 50 |
| INVENTION | 6 | (D) | 0.42 | 0.52 | — | 0.06 | 3.5 | 0.42 | 0.52 | 0.06 | 50 |
| | 7 | (E) | 0.15 | — | 0.80 | 0.05 | 5 | 0.30 | 0.65 | 0.05 | 50 |
| | 8 | (F) | 0.40 | 0.45 | — | 0.15 | 7 | 0.40 | 0.45 | 0.15 | 70 |
| | 9 | (G) | — | — | — | — | — | 0.45 | 0.45 | 0.10 | 40 |
| | 10 | (G) | 0.45 | 0.45 | — | 0.10 | 4 | 0.45 | 0.45 | 0.10 | 40 |
| | 11 | (H) | 0.75 | — | 0.15 | 0.10 | 10 | 0.45 | 0.40 | 0.15 | 100 |

| | HARD COATING LAYER | | | | | |
|---|---|---|---|---|---|---|
| | UPPER LAYER/THIN LAYER B | | | | UPPER-LAYER | |
| | TARGET COMPOSITION (ATOMIC RATIO) | | | ONE-LAYER TARGET LAYER THICKNESS | TOTAL TARGET LAYER THICKNESS | NUMBER OF DRILLED |
| TYPE | | Al | Ti | Si | (nm) | (μm) | HOLES |
| COATED | 1 | 0.47 | 0.50 | 0.03 | 20 | 1 | 6500 |
| CEMENTED | 2 | 0.47 | 0.50 | 0.03 | 20 | 1 | 7800 |

TABLE 8-continued

| | | | | | | | |
|---|---|---|---|---|---|---|---|
| CARBIDE | 3 | 0.45 | 0.48 | 0.07 | 50 | 5 | 7500 |
| DRILL | 4 | 0.05 | 0.94 | 0.01 | 60 | 8 | 6800 |
| OF THE | 5 | 0.50 | 0.45 | 0.05 | 70 | 1.5 | 6700 |
| INVENTION | 6 | 0.50 | 0.45 | 0.05 | 70 | 1.5 | 8000 |
| | 7 | 0.15 | 0.80 | 0.05 | 30 | 3 | 7300 |
| | 8 | 0.35 | 0.63 | 0.02 | 40 | 10 | 7000 |
| | 9 | 0.55 | 0.40 | 0.05 | 30 | 4 | 2800 |
| | 10 | 0.55 | 0.40 | 0.05 | 30 | 4 | 3200 |
| | 11 | 0.75 | 0.15 | 0.10 | 80 | 5 | 3000 |

The compositions of the layers, namely, the under layer and the upper layer composed of an alternately laminated layer structure of the thin layers A and B, which constitute the hard coating layer of the coated cemented carbide drills 1 to 11 of the invention, and the composition of the hard coating layer of the comparative coated cemented carbide drills 1 to 11 were measured by an energy dispersive X-ray analysis method using a transmission electron microscope. The results of this measurement show that each layer has a substantially same composition as its target composition respectively. Additionally, the thickness of each layer constituting the above hard coating layer was section-measured by the transmission electron microscope. The results of this measurement show that each layer has an average thickness (average of five points) which is substantially same thickness as its target thickness.

The results in Tables 8 and 9 show clearly the followings facts.

The hard coating layer of each of the coated cemented carbide drills of the invention is constituted by the alternately laminated layer of the thin layer A and the thin layer B, and/or the under layer;

has excellent high-temperature hardness and thermoplastic deformation resistance, and has also excellent high-temperature toughness and high-temperature strength.

Therefore, even in a drilling performed under the high-speed drilling conditions in which high temperature is generated, and a large impact and/or mechanical load is applied, the hard coating layer can exhibit its excellent wear resistance without the occurrence of chipping or fractures.

On the other hand, if a comparative coated cemented carbide drills, on which a hard coating layer composed of an (Al, Cr, Si)N layer (or a hard coating layer composed of an (Al, Ti, Si)N layer) having a single layer structure is formed, is used under the above high-speed drilling conditions; such drill's insufficient toughness causes fractures or chipping. Also, such drill's poor wear resistance makes its usable life time relatively short period.

INDUSTRIAL APPLICABILITY

The above Examples 1 to 5 clarify the following facts. The surface-coated cutting tools of the present invention (for example, the coated high-speed steel gear cutters of the invention, the coated cemented carbide end mills of the invention, the coated high-speed steel end mills of the invention, and the coated cemented carbide drills of the invention) exhibit excellent fracture resistance and wear resistance, and show excellent cutting performance for a prolonged period of time, even if these cutting tools are used in the high-speed gear cutting, high-speed milling, and high-speed drilling in which high temperature is generated, and a large impact and mechanical load is applied, as well as in cutting processing under normal cutting conditions of various kinds of steel or cast iron. Therefore, it is possible to be sufficiently satisfied with the demand for a high performance cutting apparatus, labor-saving and energy-saving in cutting process, and cost reduction.

The invention claimed is:

1. A surface-coated cutting tool comprising a hard coating layer formed on a surface of a tool substrate, the hard coating layer is composed of an alternately laminated layer structure of at least a thin layer A and a thin layer B, in which the thin layer A has a thickness of 0.01 to 0.1 μm, the thin layer B has a thickness of 0.01 to 0.1 μm, and a total thickness of the thin layers A and B is within 1 to 10 μm:

(a) the thin layer A is a complex nitride layer of Al, Cr and Si, and when expressing a composition of the complex nitride layer as a compositional formula $[Al_XCr_YSi_Z]N$, each X, Y and Z satisfies the relations, $$0.2 \leq X \leq 0.45,\ 0.4 \leq Y \leq 0.75,\ 0.01 \leq Z \leq 0.2,\ \text{and}\ X+Y+Z=1$$

(where all of X, Y, and Z are atomic ratios); and (b) the thin layer B is a complex nitride layer of Al, Ti, and Si, and when expressing a composition of the complex nitride layer as a compositional formula $[Al_UTi_VSi_W]N$, each U, V and W satisfies the relations, $$0.05 \leq U \leq 0.75,\ 0.15 \leq V 0.94,\ 0.01 \leq W \leq 0.1,\ \text{and}\ U+V+W=1$$

(where all of U, V, and W are atomic ratios), wherein the hard coating layer includes:

an upper layer composed of an alternately laminated layer structure of the thin layer A and the thin layer B, and an under layer formed so as to be interposed between the upper layer and the surface of the tool substrate; and the under layer has a composition which satisfies the compositional formula of the thin layer A *or the thin layer B*.

2. The surface-coated cutting tool according to claim 1, wherein the under layer has a thickness of 0.5 to 10 μm.

[3. The surface-coated cutting tool according to claim 1, wherein its hard coating layer includes an upper layer composed of an alternately laminated layer structure of the thin layer A and the thin layer B, and a under layer formed so as to be interposed between the upper layer and the surface of the tool substrate, and the under layer has a thickness of 0.5 to 10 μm, and has a composition which satisfies the compositional formula of the thin layer B.]

4. The surface-coated cutting tool according to claim 1, wherein the surface-coated cutting tool is a gear cutter in which its tool substrate is made of a high-speed tool steel.

5. The surface-coated cutting tool according to claim 1, wherein the surface-coated cutting tool is an end mill in which its tool substrate is made of a high-speed tool steel.

6. The surface-coated cutting tool according to claim 1, wherein the surface-coated cutting tool is an end mill or a drill in which its tool substrate is made of tungsten-carbide-based cemented carbide.

7. The surface-coated cutting tool according to claim 2, wherein the surface-coated cutting tool is a gear cutter in which its tool substrate is made of a high-speed tool steel.

[8. The surface-coated cutting tool according to claim 3, wherein the surface-coated cutting tool is a gear cutter in which its tool substrate is made of a high-speed tool steel.]

9. The surface-coated cutting tool according to claim 2, wherein the surface-coated cutting tool is an end mill in which its tool substrate is made of a high-speed tool steel.

[10. The surface-coated cutting tool according to claim 3, wherein the surface-coated cutting tool is an end mill in which its tool substrate is made of a high-speed tool steel.]

11. The surface-coated cutting tool according to claim 2, wherein the surface-coated cutting tool is an end mill or a drill in which its tool substrate is made of tungsten-carbide-based cemented carbide.

[12. The surface-coated cutting tool according to claim 3, wherein the surface-coated cutting tool is an end mill or a drill in which its tool substrate is made of tungsten-carbide-based cemented carbide.]

* * * * *